(12) United States Patent
Tanaka et al.

(10) Patent No.: US 11,935,801 B2
(45) Date of Patent: Mar. 19, 2024

(54) ELECTRONIC COMPONENT BUILT-IN WIRING BOARD AND METHOD FOR MANUFACTURING THE SAME

(71) Applicant: IBIDEN CO., LTD., Gifu (JP)

(72) Inventors: Yusuke Tanaka, Ogaki (JP); Tomohiro Futatsugi, Ogaki (JP); Yuichi Nakamura, Ogaki (JP); Yoshiki Matsui, Ogaki (JP); Keinosuke Ino, Ogaki (JP); Tomohiro Fuwa, Ogaki (JP); Seiji Izawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/730,623

(22) Filed: Apr. 27, 2022

(65) Prior Publication Data

US 2022/0254693 A1    Aug. 11, 2022

Related U.S. Application Data

(63) Continuation of application No. 16/869,945, filed on May 8, 2020, now Pat. No. 11,437,290.

(30) Foreign Application Priority Data

May 9, 2019 (JP) ................... 2019-088781

(51) Int. Cl.
*H01L 23/538* (2006.01)
*H01L 21/48* (2006.01)
(Continued)

(52) U.S. Cl.
CPC .......... *H01L 23/13* (2013.01); *H01L 21/4853* (2013.01); *H01L 21/4857* (2013.01);
(Continued)

(58) Field of Classification Search
CPC ........... H01L 21/4857; H01L 23/49822; H01L 23/5389
See application file for complete search history.

(56) References Cited

U.S. PATENT DOCUMENTS

| 6,239,980 B1 | 5/2001 | Fillion et al. |
| 7,960,272 B2 | 6/2011 | Lee et al. |
| (Continued) | | |

FOREIGN PATENT DOCUMENTS

| EP | 1 253 813 A1 | 10/2002 |
| JP | S57-039548 A | 3/1982 |
| JP | 2006-019441 A | 1/2006 |

*Primary Examiner* — Michele Fan
(74) *Attorney, Agent, or Firm* — Oblon, McClelland, Maier & Neustadt, L.L.P.

(57) ABSTRACT

An electronic component built-in wiring board includes a substrate having a cavity, an electronic component accommodated in the cavity of the substrate and having pads on a surface of the component, a coating insulating layer formed on the substrate such that the insulating layer is covering the component and has via holes, via conductors formed in the via holes such that the via conductors are penetrating through the insulating layer, and a resin coating formed between the component and the insulating layer and having through holes such that the through holes are partially exposing the pads in the via holes and that the coating has adhesion to the component that is stronger than adhesion of the insulating layer to the component. The via conductors are formed in the via holes and the through holes such that the via conductors are connected to the pads on the surface of the component.

20 Claims, 17 Drawing Sheets

(51) Int. Cl.
*H01L 21/56* (2006.01)
*H01L 23/13* (2006.01)
*H01L 23/29* (2006.01)
*H01L 23/31* (2006.01)
*H01L 23/498* (2006.01)

(52) U.S. Cl.
CPC ............ *H01L 21/56* (2013.01); *H01L 23/291* (2013.01); *H01L 23/3171* (2013.01); *H01L 23/49811* (2013.01); *H01L 23/49822* (2013.01); *H01L 23/49838* (2013.01)

(56) References Cited

U.S. PATENT DOCUMENTS

| | | | |
|---|---|---|---|
| 2003/0178726 A1* | 9/2003 | Ogawa | H01L 24/24 257/E23.062 |
| 2005/0048759 A1 | 3/2005 | Hsu | |
| 2008/0185739 A1 | 8/2008 | Chang et al. | |
| 2008/0237879 A1* | 10/2008 | Yang | H01L 24/18 438/106 |

* cited by examiner

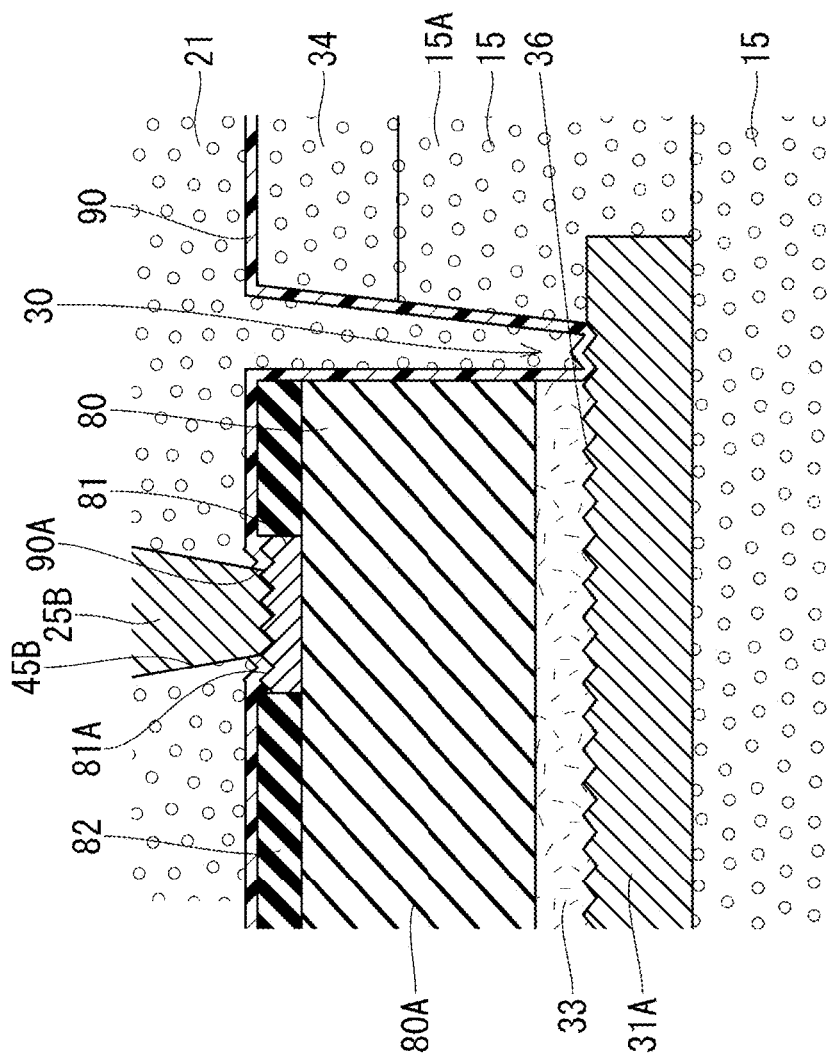

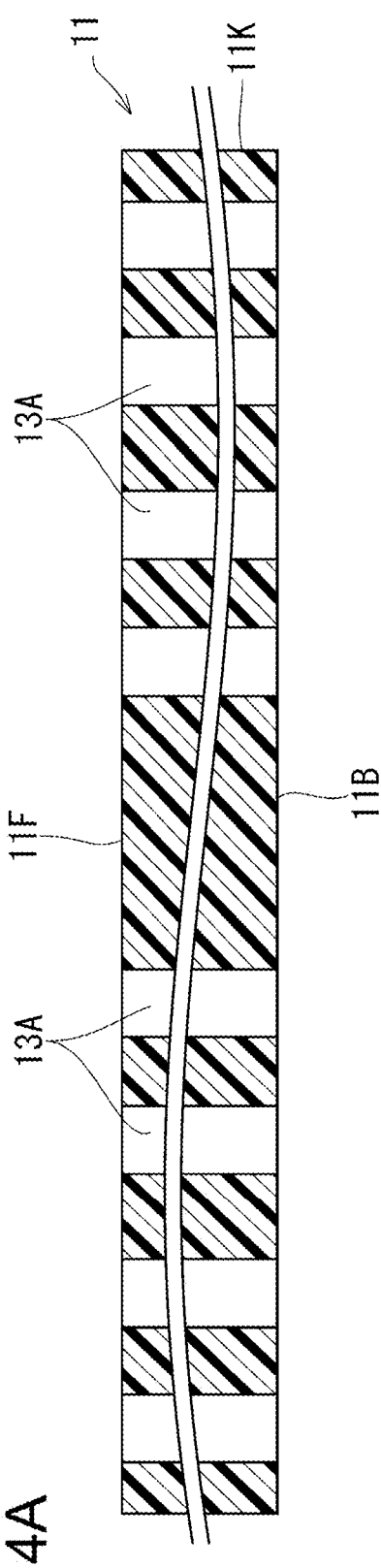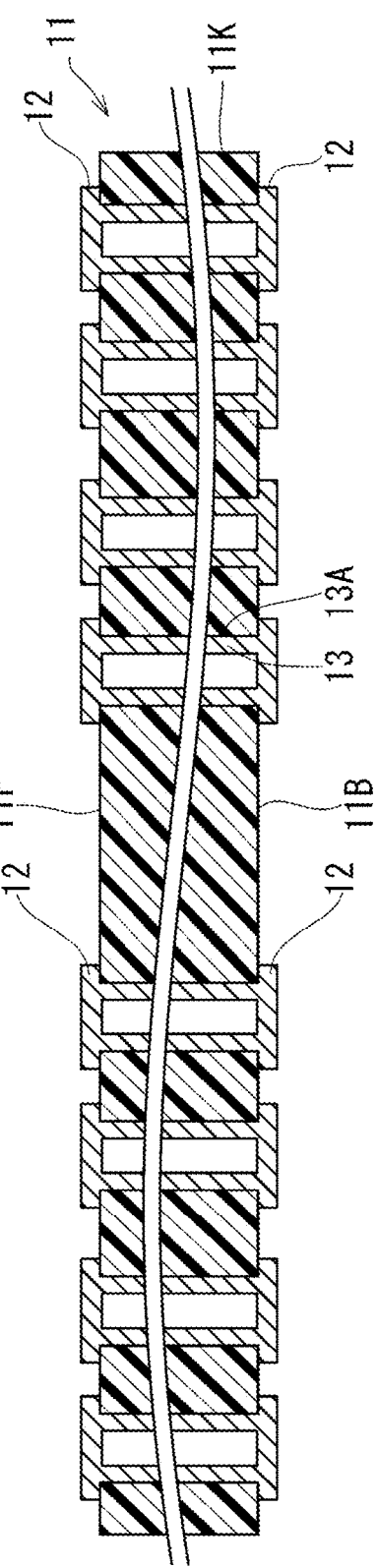

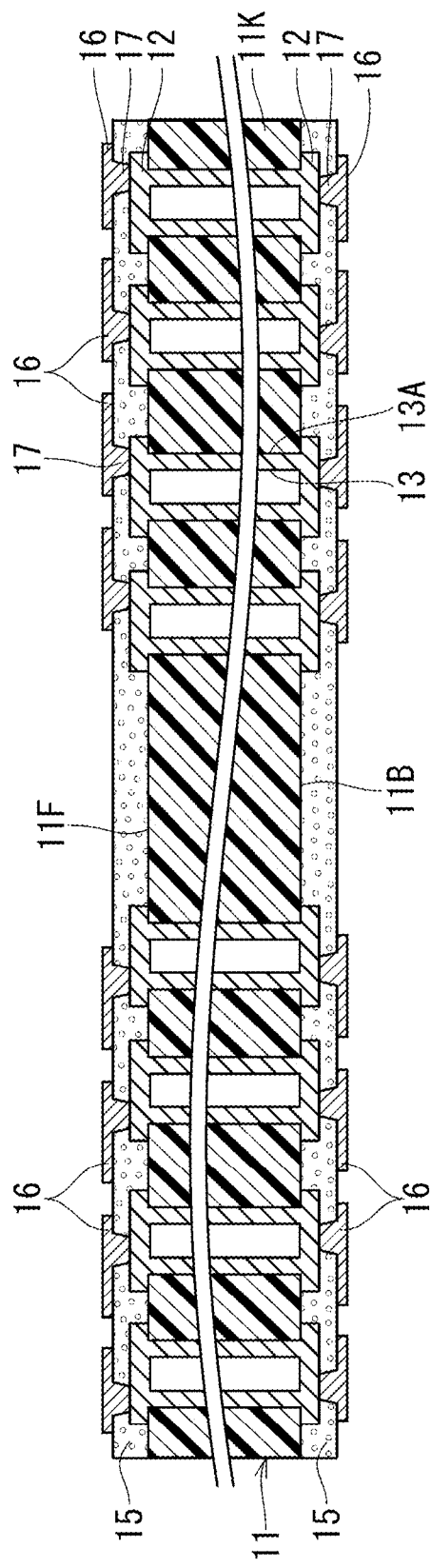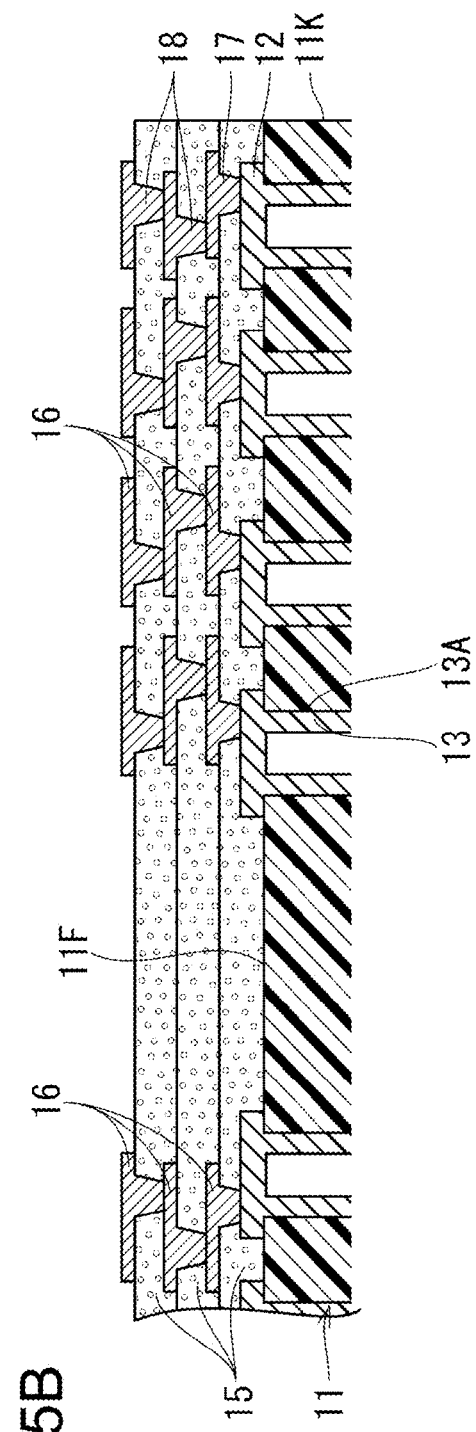

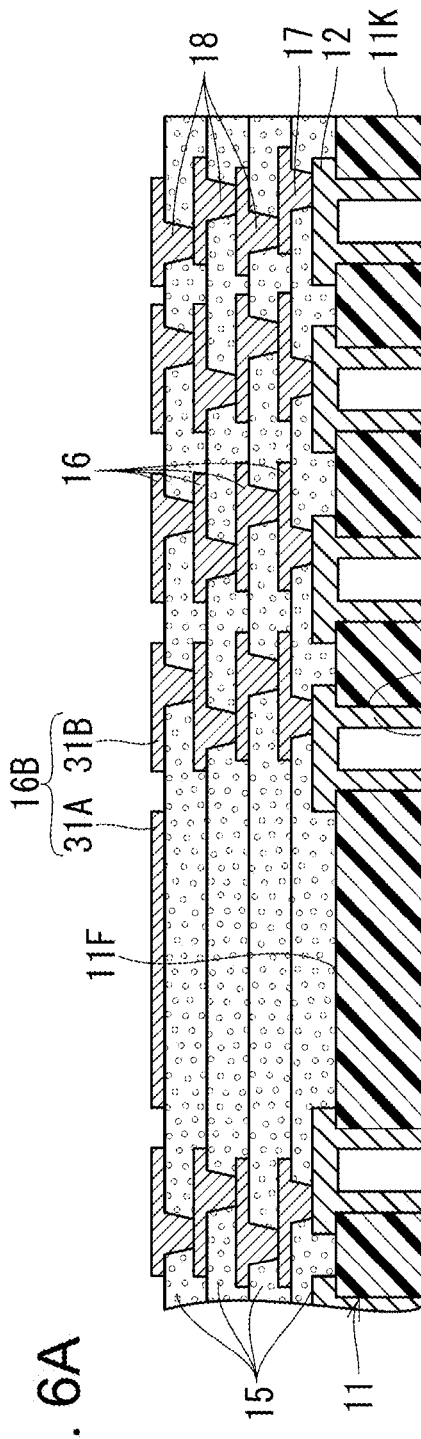
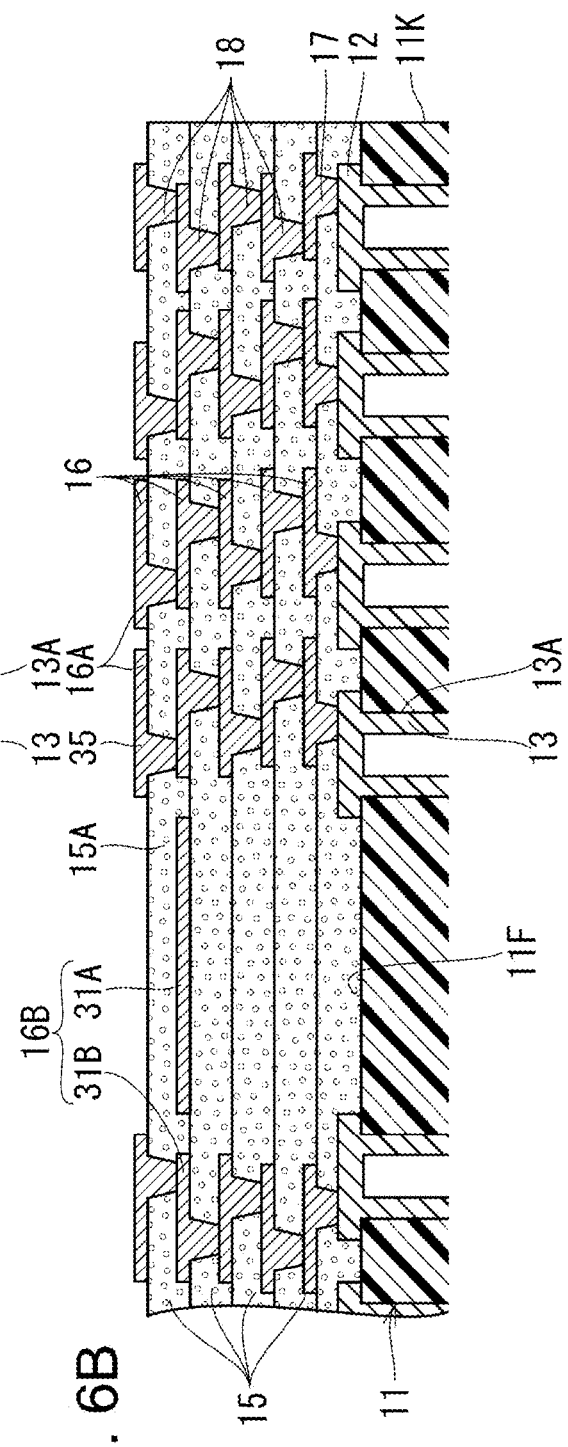
FIG. 6A
FIG. 6B

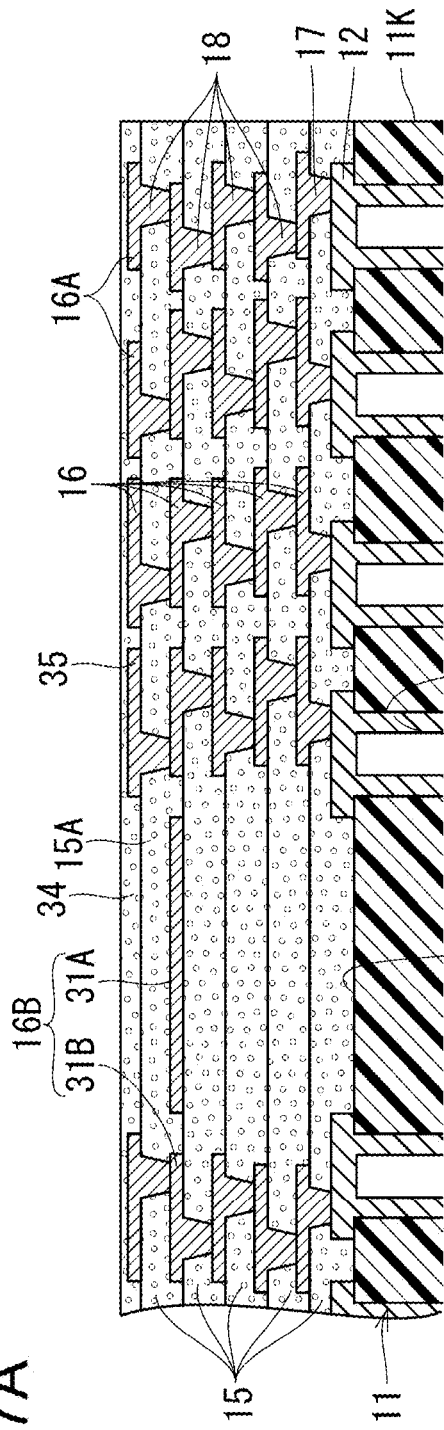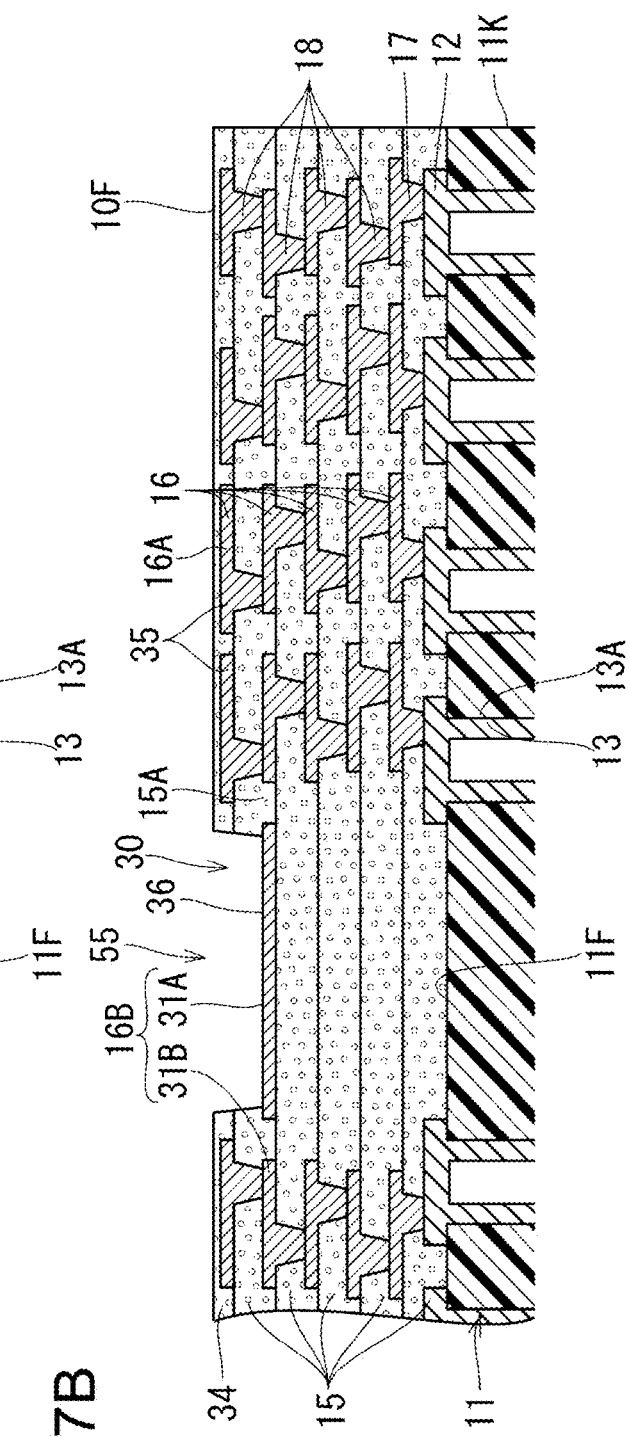

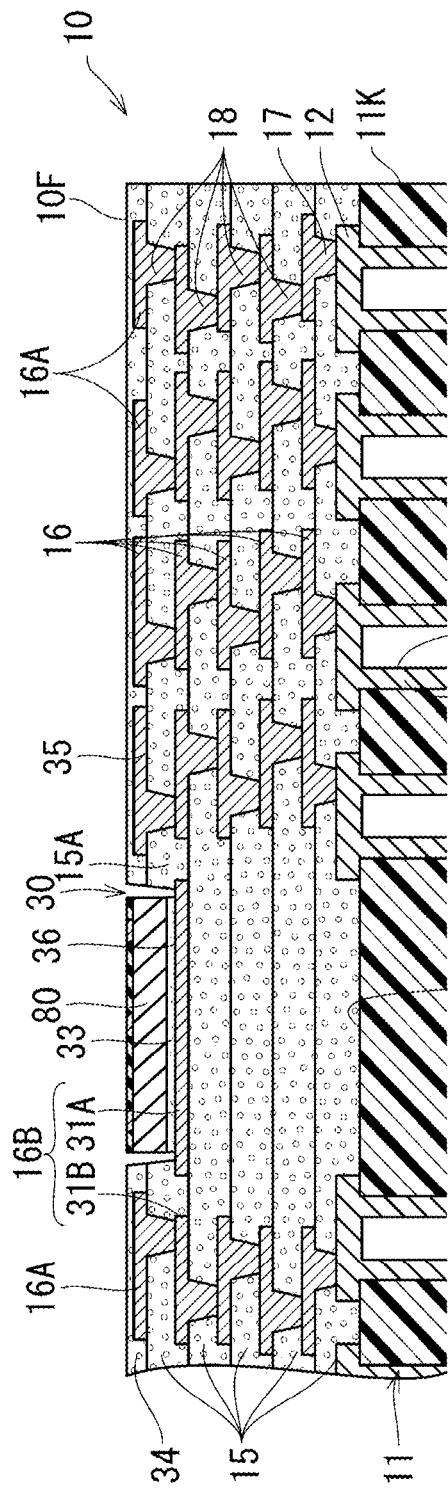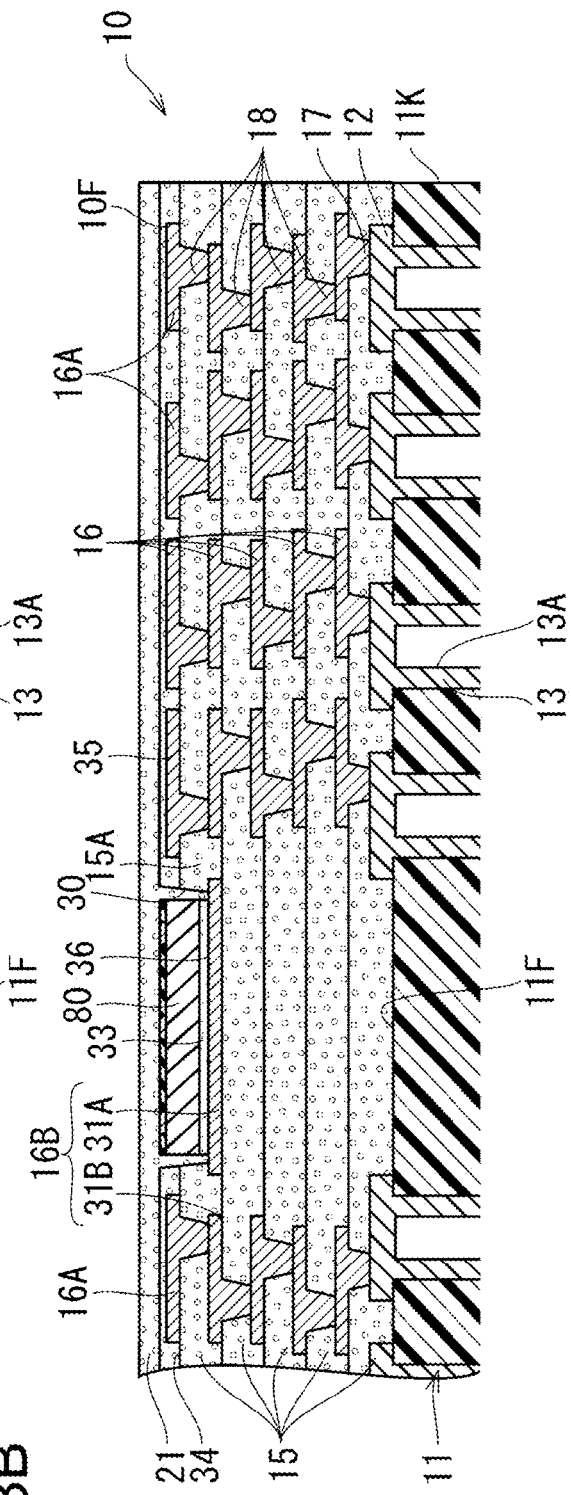

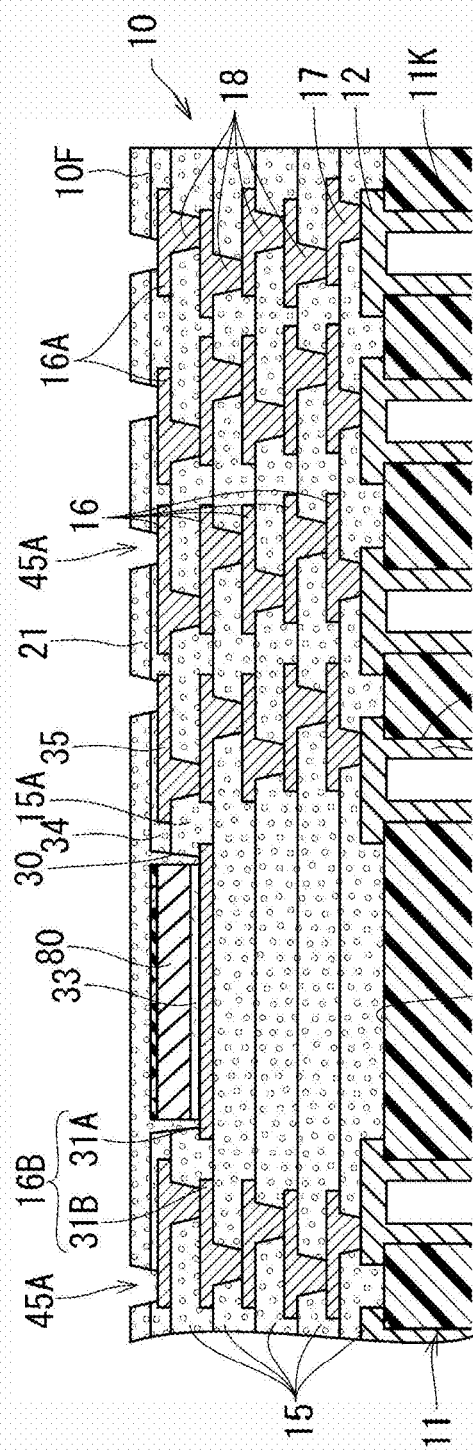
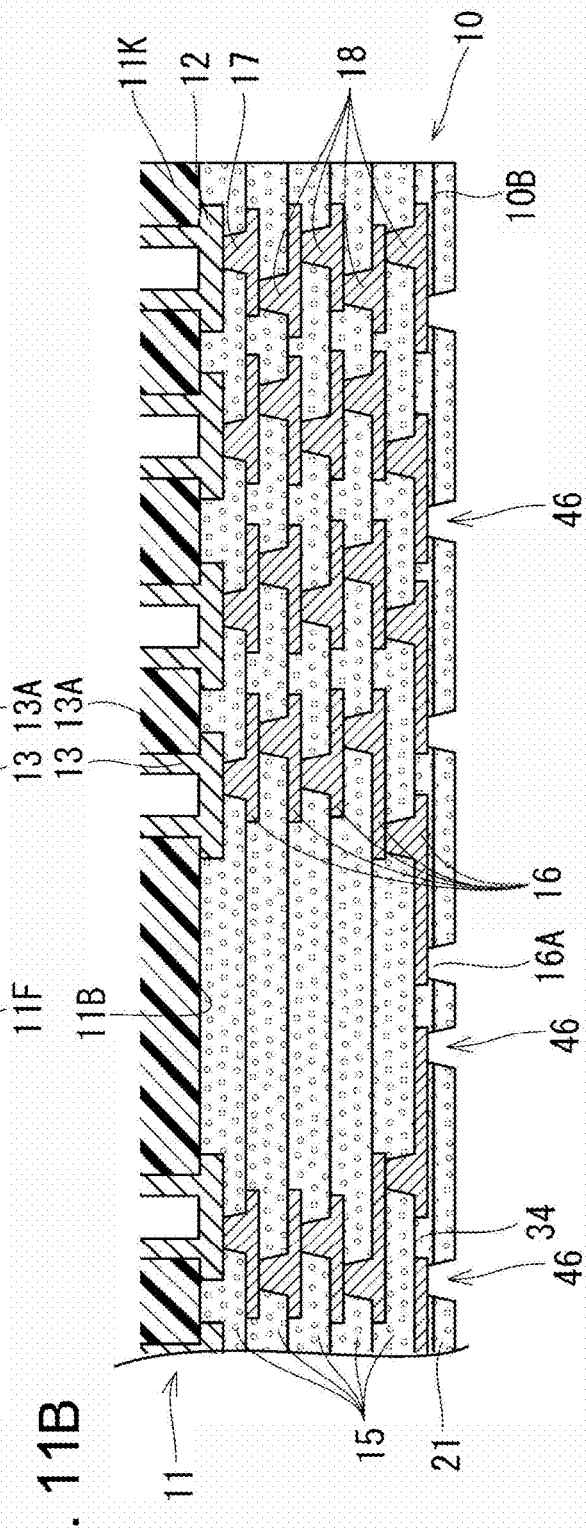
FIG. 11A
FIG. 11B

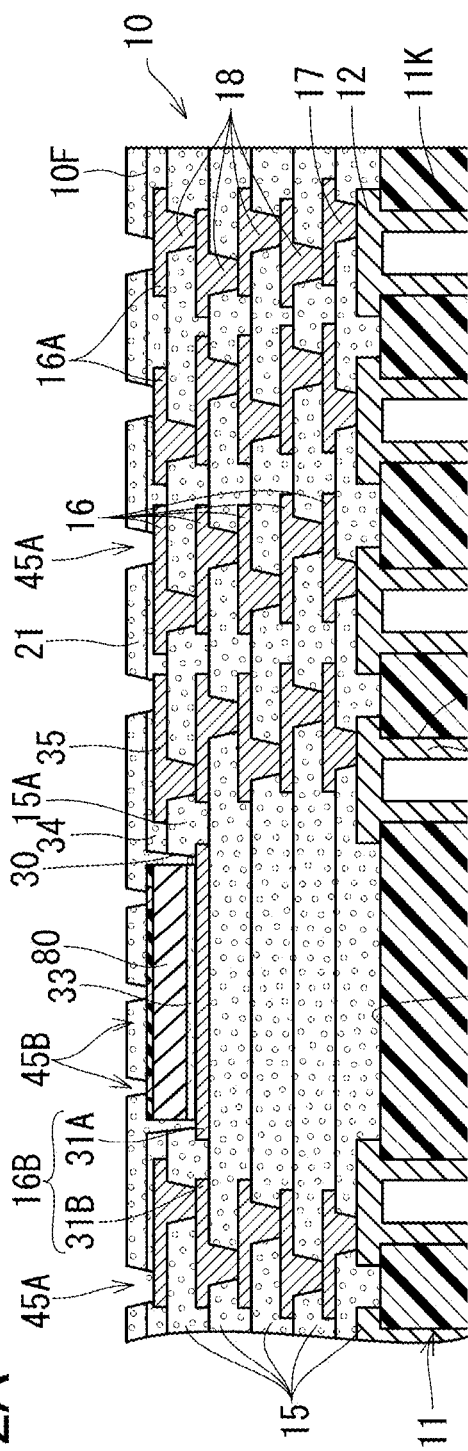
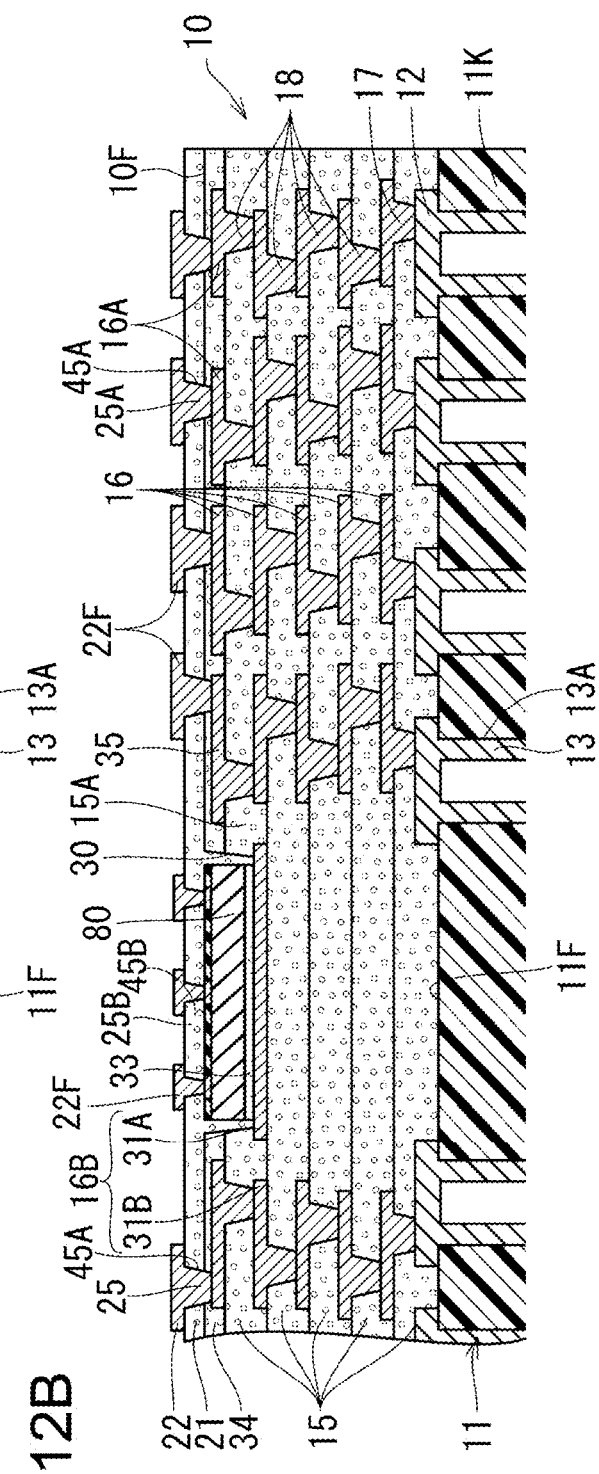

ELECTRONIC COMPONENT BUILT-IN WIRING BOARD AND METHOD FOR MANUFACTURING THE SAME

CROSS-REFERENCE TO RELATED APPLICATIONS

The present application is a continuation of U.S. patent application Ser. No. 16/869,945, filed May 8, 2020, which is based upon and claims the benefit of priority to Japanese Patent Application No. 2019-088781, filed May 9, 2019. The entire contents of these applications are incorporated herein by reference.

BACKGROUND OF THE INVENTION

Field of the Invention

The present invention relates to an electronic component built-in wiring board in which an electronic component is accommodated in a cavity, and a method for manufacturing the electronic component built-in wiring board.

Description of Background Art

Japanese Patent Application Laid-Open Publication No. 2006-019441 describes an electronic component built-in wiring board in which an electronic component is covered by a coating insulating layer. The entire contents of this publication are incorporated herein by reference.

SUMMARY OF THE INVENTION

According to one aspect of the present invention, an electronic component built-in wiring board includes a substrate having a cavity, an electronic component accommodated in the cavity of the substrate and having pads on a surface of the electronic component, a coating insulating layer formed on the substrate such that the coating insulating layer is covering the electronic component and has via holes, via conductors formed in the via holes respectively such that the via conductors are penetrating through the coating insulating layer, and a resin coating formed between the electronic component and the coating insulating layer and having through holes such that the through holes are partially exposing the pads in the via holes respectively and that the resin coating has an adhesion to the electronic component that is stronger than an adhesion of the coating insulating layer to the electronic component. The via conductors are formed in the via holes and the through holes respectively such that the via conductors are connected to the pads on the surface of the electronic component.

According to another aspect of the present invention, a method for manufacturing an electronic component built-in wiring board includes forming a structure including a substrate having a cavity, an electronic component accommodated in the cavity of the substrate and having pads on a surface of the electronic component, a coating insulating layer formed on the substrate such that the coating insulating layer is covering the electronic component and has via holes, and a resin coating formed between the electronic component and the coating insulating layer and having through holes such that the through holes are partially exposing the pads in the via holes respectively, and forming via conductors in the via holes and the through holes respectively such that the via conductors are connected to the pads on the surface of the electronic component. The resin coating has an adhesion to the electronic component that is stronger than an adhesion of the coating insulating layer to the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a cross-sectional view around a cavity of the electronic component built-in wiring board;

FIGS. 4A and 4B are cross-sectional views illustrating manufacturing processes of a cavity-having substrate;

FIGS. 5A and 5B are cross-sectional views illustrating manufacturing processes of the cavity-having substrate;

FIGS. 6A and 6B are cross-sectional views illustrating manufacturing processes of the cavity-having substrate;

FIGS. 7A and 7B are cross-sectional views illustrating manufacturing processes of the cavity-having substrate;

FIGS. 8A and 8B are cross-sectional views illustrating manufacturing processes of the electronic component built-in wiring board;

FIGS. 11A and 11B are cross-sectional views illustrating manufacturing processes of the electronic component built-in wiring board;

FIGS. 12A and 12B are cross-sectional views illustrating manufacturing processes of the electronic component built-in wiring board;

DETAILED DESCRIPTION OF THE EMBODIMENTS

Figure 1:
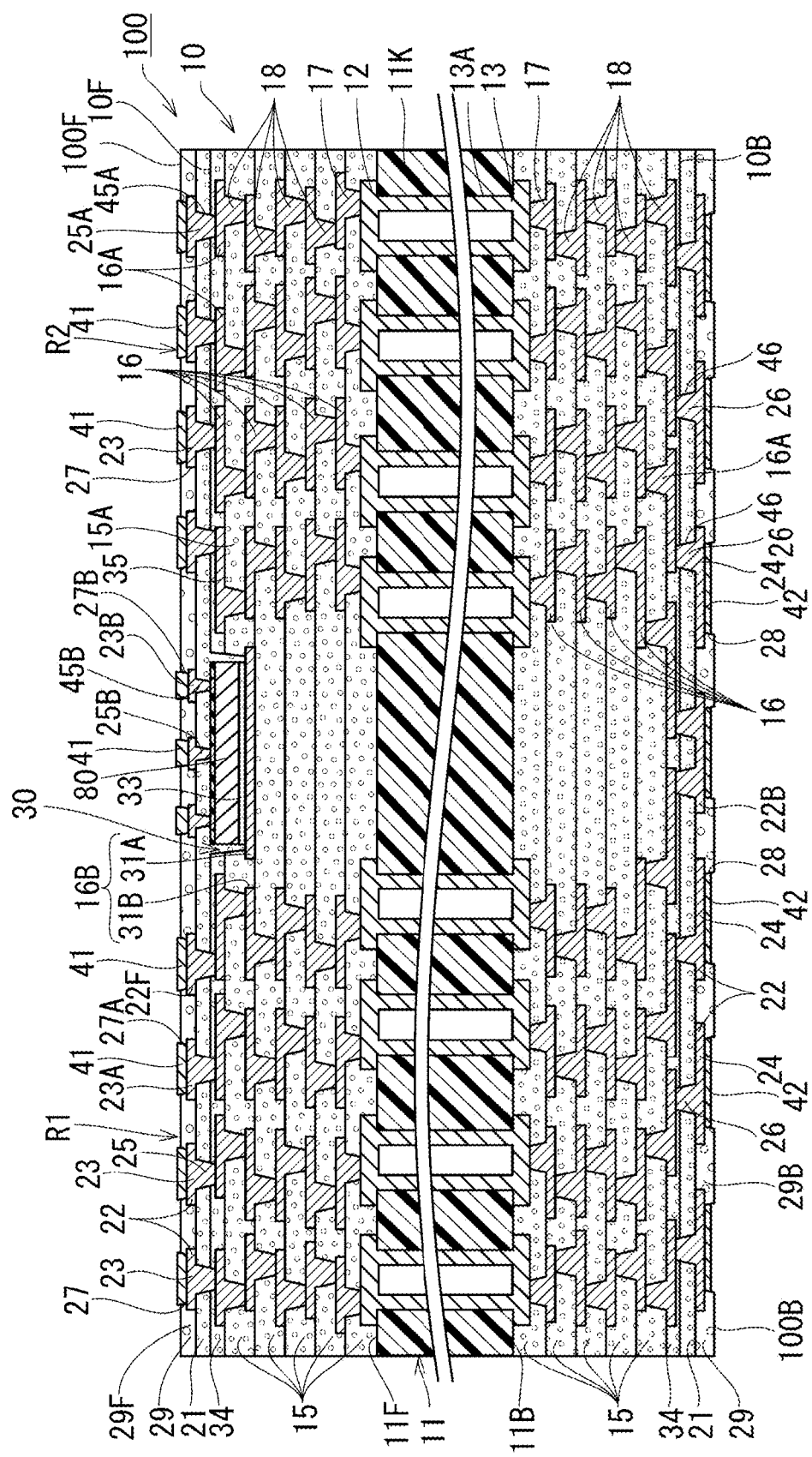
FIG. 1 is a cross-sectional view of an electronic component built-in wiring board according to an embodiment of the present invention.

Embodiments will now be described with reference to the accompanying drawings, wherein like reference numerals designate corresponding or identical elements throughout the various drawings.

In the following, an embodiment of the present invention is described with reference to FIGS. 1-17. As illustrated in FIG. 1, an electronic component built-in wiring board 100 according to the present embodiment has a structure in which an outer side build-up insulating layer 21 formed of an insulating material (for example, a resin film or a prepreg) and an outer side build-up conductor layer 22 formed of a metal (for example, copper) are laminated on each of both front and back sides of a cavity-having substrate 10 (see FIG. 2) in which a semiconductor component 80 as an electronic component is accommodated in a cavity 30, and the outer side build-up conductor layers 22 are each covered by a solder resist layer 29. The solder resist layers 29 respectively form an F surface (100F) as a front side surface of the electronic component built-in wiring board 100 and a B surface (100B) as a back side surface of the electronic component built-in wiring board 100.

As illustrated in FIG. 1, in an F-surface solder resist layer (29F) that forms the F surface (100F) of the electronic component built-in wiring board 100, multiple openings 27 are formed that respectively expose portions of an F-surface outer side build-up layer (22F) as conductor pads 23, the F-surface outer side build-up layer (22F) being one of the outer side build-up layers 22 and being positioned on the F surface (100F) side. Specifically, the conductor pads 23 include first conductor pads (23A) that are positioned on an outer side of the cavity 30 when viewed from a thickness direction and second conductor pads (23B) that overlap the semiconductor component 80, and the multiple openings 27 include multiple first openings (27A) that respectively expose the first conductor pads (23A) and multiple second openings (27B) that respectively expose the second conductor pads (23B).

Further, in a B-surface solder resist layer (29B) on the B surface (100B) side of the electronic component built-in wiring board 100, multiple third openings 28 are formed that respectively expose portions of a B-surface outer side build-up conductor layer (22B) on the B surface (100B) side as third conductor pads 24.

F-surface plating layers 41 are respectively formed on the first conductor pads (23A) and the second conductor pads (23B). The F-surface plating layers 41 on the first conductor pads (23A) are respectively filled in the first openings (27A) and each protrude in a bump-like shape to an outer side of the F-surface solder resist layer (29F). Similarly, the F-surface plating layers 41 on the second conductor pads (23B) are also respectively filled in the second openings (27B) and each protrude to the outer side of the F-surface solder resist layer (29F). Further, B-surface plating layers 42 are respectively formed on the third conductor pads 24. The B-surface plating layers 42 are respectively formed at bottoms of the third openings 28, and are recessed with respect to an outer surface of the B-surface solder resist layer (29B). The F-surface plating layers 41 and the B-surface plating layers 42 are each formed of an electroless Ni/Pd/Au metal layer.

Figure 2:
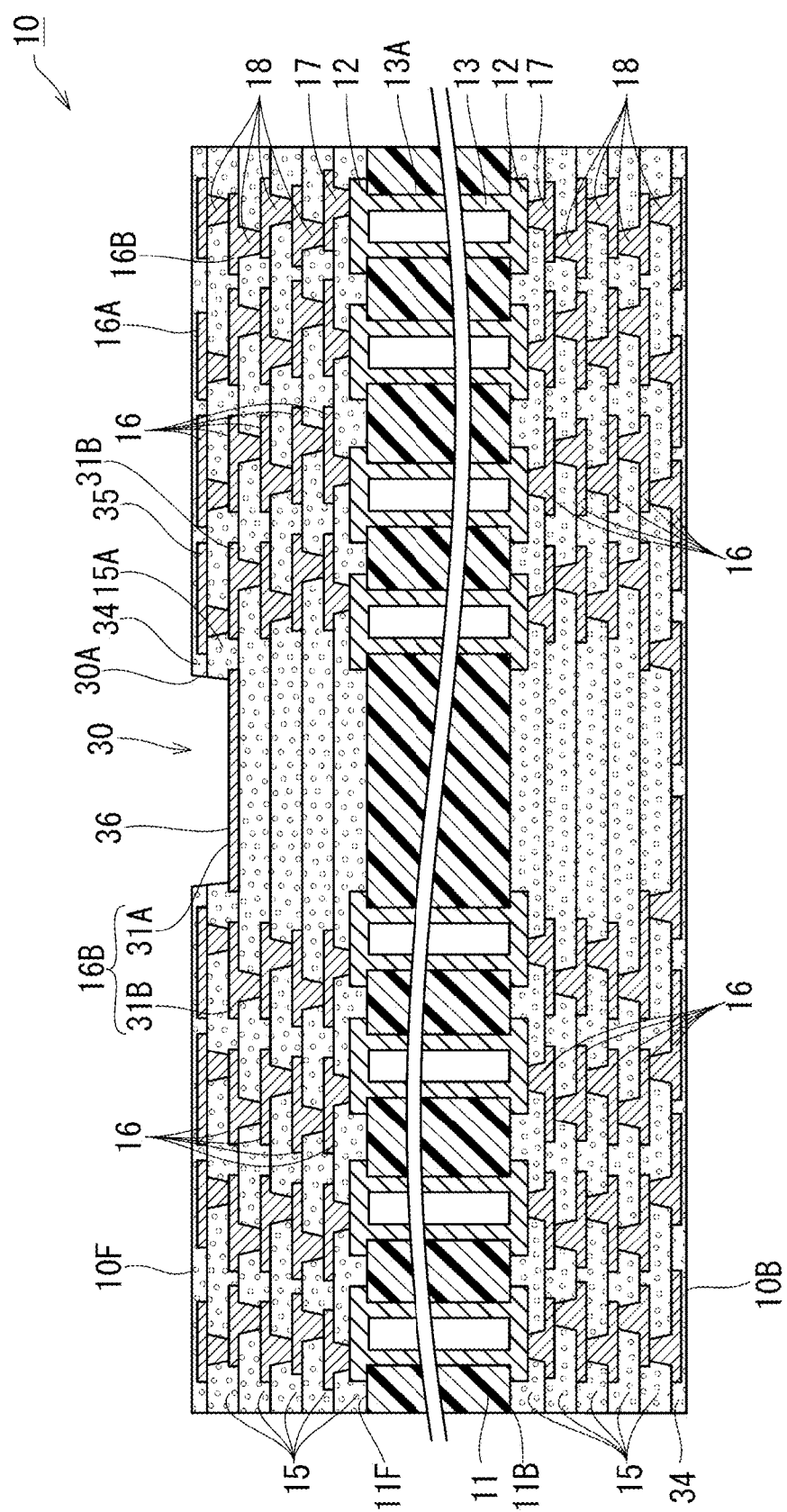
FIG. 2 is a cross-sectional view of a cavity-having substrate.

As illustrated in FIG. 2, the cavity-having substrate 10 has a multilayer structure in which build-up insulating layers 15 and build-up conductor layers 16 are alternately laminated on each of both an F surface (11F) as a front side surface and a B surface (11B) as a back side surface of a core substrate 11. The build-up insulating layers 15 are formed of the same material as the above-described outer side build-up insulating layers 21, and the build-up conductor layers 16 are formed of the same material as the above-described outer side build-up conductor layers 22.

A core conductor layer 12 is formed on each of both the front and back sides of the core substrate 11. The front side core conductor layer 12 and the back side core conductor layer 12 are connected to each other by through-hole conductors 13 penetrating the core substrate 11. The through-hole conductors 13 are formed by forming, for example, copper plating on wall surfaces of through holes (13A) penetrating the core substrate 11.

An innermost build-up conductor layer 16, which is closest to the core substrate 11, and a core conductor layer 12 are connected to each other by via conductors 17 penetrating an innermost build-up insulating layer 15. Further, build-up conductor layers (16, 16) that are adjacent to each other in a lamination direction are connected to each other by via conductors 18 penetrating a build-up insulating layer 15 positioned between the adjacent build-up conductor layers (16, 16).

A conductor circuit layer (31B) and a plane layer (31A) are formed in a second build-up conductor layer (16B) that is among the build-up conductor layers 16 laminated on the F surface (11F) side of the core substrate 11 and is positioned second from an outer side. The plane layer (31A) is a ground layer that is formed in a solid shape and is grounded.

In a first build-up conductor layer (16A) that is among the build-up conductor layers 16 laminated on the F surface (11F) side of the core substrate 11 and is positioned outermost, a conductor circuit layer 35 is formed that is connected via the via conductors 18 to the conductor circuit layer (31B). Further, a protective insulating layer 34 is laminated on the first build-up conductor layer (16A). The protective insulating layer 34 is formed of the same material as the build-up insulating layers 15. The protective insulating layer 34 is thinner than each of the build-up insulating layers 15. The protective insulating layers 34 respectively form the F surface (10F) as the front side surface of the cavity-having substrate 10 and the B surface (10B) as the back side surface of the cavity-having substrate 10. It is also possible that the protective insulating layer 34 on the back side surface of the cavity-having substrate 10 is not formed. Further, it is also possible that the protective insulating layers 34 each have the same thickness as that of each of the build-up insulating layers 15.

As illustrated in FIG. 2, the cavity 30 having an opening (30A) on the F surface (10F) is formed in the cavity-having substrate 10. The cavity 30 penetrates a first build-up insulating layer (15A) positioned on an outermost side and the protective insulating layer 34, and exposes the plane layer (31A) as a bottom surface of the cavity 30. Further, an inner peripheral surface of the cavity 30 is inclined such that the cavity 30 is reduced in cross section toward the bottom surface side (the plane layer (31A) side). It is also possible that the inner peripheral surface of the cavity 30 rises substantially perpendicular to the plane layer (31A).

An area of the bottom surface of the cavity 30 is smaller than an area of the plane layer (31A), and an outer peripheral portion of the plane layer (31A) protrudes to an outer side of the cavity 30. In other words, the plane layer (31A) forms the entire bottom surface of the cavity 30. Further, as illustrated in FIG. 3, a roughened part 36 is formed on a surface of a portion of the plane layer (31A) exposed as the bottom surface of the cavity 30.

The above-described conductor pads (23, 24) are connected to the first build-up conductor layers (16A) or the semiconductor component 80 via via conductors (25, 26) (see FIG. 1). Specifically, the first conductor pads (23A) and the third conductor pads 24 are connected to the first build-up conductor layers (16A) via first via conductors (25A) and the third via conductors 26, and the second conductor pads (23B) are connected to the semiconductor component 80 via second via conductors (25B).

The first via conductors (25A) and the third via conductors 26 are formed by filling plating in first via formation holes (45A) and third via formation holes 46 that penetrate the outer side build-up insulating layer 21 and the protective insulating layer 34, and the second via conductors (25B) are formed by filling plating in second via formation holes (45B) that penetrate the outer side build-up insulating layer 21. The second via formation holes (45B) are formed on the semiconductor component 80 and each expose a portion of the surface of the semiconductor component 80. A hole diameter of each of the second via formation holes (45B) is smaller than that of each of the first via formation holes (45A) and the third via formation holes 46. The first via formation holes (45A), the second via formation holes (45B) and the third via formation holes 46 are each formed in a tapered shape that is reduced in diameter toward a bottom thereof.

As described above, the semiconductor component 80 is accommodated in the cavity 30. Specifically, as illustrated in FIG. 1, an adhesive layer 33 is formed on the plane layer (31A) exposed as the bottom surface of the cavity 30, and the semiconductor component 80 is mounted on the adhesive layer 33. Here, due to the roughened part 36 formed on the surface of the plane layer (31A) exposed as the bottom surface of the cavity 30, an anchor effect acts on the adhesive layer 33, and peeling of the adhesive layer 33 from the plane layer (31A) is suppressed. The adhesive layer 33 has the same planar shape as the semiconductor component 80.

The semiconductor component 80 of the present embodiment includes a component body (80A), pads 81 provided on an upper surface of the component body (80A), and a passivation film 82 covering portions of the upper surface of the component body (80A) where the pads 81 are not formed, and the pads 81 and the passivation film 82 form a surface of the semiconductor component 80. As illustrated in FIG. 3, an upper surface of each of the pads 81 is a roughened part (81A) formed by subjecting the upper surface to a roughening treatment, and the upper surface of each of the pads 81 is slightly recessed relative to an upper surface of the passivation film 82. The passivation film 82 and the protective insulating layer 34 are substantially flush with each other. Further, the passivation film 82 is formed of, for example, silicon nitride.

Here, in the electronic component built-in wiring board 100 of the present embodiment, a resin coating 90 is formed under the outer side build-up insulating layer 21. Specifically, the resin coating 90 is formed on the F surface (10F) and the B surface (10B) of the cavity-having substrate 10, on the surface and side surface of the semiconductor component 80, on an inner side surface of the cavity 30, and on portions of the bottom surface of the cavity 30 between the inner side surface of the cavity 30 and the side surface of the semiconductor component 80. That is, the resin coating 90 is formed on the entire surfaces on the F surface (10F) side and on the B surface (10B) side of the cavity-having substrate 10 in which the semiconductor component 80 is accommodated.

The resin coating 90 is formed of, for example, an amino group-containing triazole-based compound, and has a rust prevention property. Further, adhesion between the resin coating 90 and the passivation film 82 and adhesion between the resin coating 90 and the outer side build-up insulating layer 21 are stronger than adhesion between the outer side build-up insulating layer 21 and the passivation film 82.

As illustrated in FIG. 3, through holes (90A) are respectively formed below the second via formation holes (45B) in the resin coating 90 to expose the pads 81 of the semiconductor component 80 in the second via formation holes (45B). Inner edges of the through holes (90A) are respectively flush with inner surfaces of the second via formation holes (45B). Portions of the resin coating 90 formed on the roughened parts (81A) of the pads 81 and on the roughened part 36 of the plane layer (31A) have shapes corresponding to uneven shapes of the roughened parts (81A, 36).

The description about the structure of the electronic component built-in wiring board 100 is as given above. Next, a method for manufacturing the electronic component built-in wiring board 100 is described. Here, since the electronic component built-in wiring board 100 is manufactured using the cavity-having substrate 10, in the following, first, a method for manufacturing the cavity-having substrate 10 is described.

The cavity-having substrate 10 is manufactured as follows.

(1) As illustrated in FIG. 4A, the through holes (13A) are formed in the core substrate 11 by, for example, drilling or the like. The core substrate 11 is obtained by laminating a copper foil (not illustrated in the drawings) on each of both an F surface (11F), which is a front side surface of an insulating base material (11K), and a B surface (11B), which is a back side surface of the insulating base material (11K), the insulating base material (11K) being formed of an epoxy resin or a BT (bismaleimide triazine) resin and a reinforcing material such as a glass cloth.

(2) By an electroless plating treatment, a plating resist treatment and an electrolytic plating treatment, the core conductor layer 12 is formed on each of the F surface (11F) and the B surface (11B) of the core substrate 11, and the through-hole conductors 13 are formed on the inner surfaces of the through holes (13A) (see FIG. 4B).

(3) As illustrated in FIG. 5A, a build-up insulating layer 15 is laminated on the core conductor layer 12, and a build-up conductor layer 16 is laminated on the build-up insulating layer 15. Specifically, a resin film as a build-up insulating layer 15 is laminated on the core conductor layer 12 on each of the F surface (11F) side and the B surface (11B) side of the core substrate 11, and then, the resulting substrate is hot-pressed. Then, CO2 laser is irradiated to the resin film, and via formation holes penetrating the build-up insulating layer 15 are formed. Then, an electroless plating treatment, a plating resist treatment and an electrolytic plating treatment are performed. The via formation holes are filled with electrolytic plating and the via conductors 17 are formed, and a build-up conductor layer 16 of a predetermined pattern is formed on the build-up insulating layer 15. It is also possible that, as the build-up insulating layer 15, instead of the resin film, a prepreg (B-stage resin sheet obtained by impregnating a core material with resin) is used. In this case, a copper foil is laminated together with the prepreg.

(4) Similar to the process of FIG. 5A, build-up insulating layers 15 and build-up conductor layers 16 are alternately laminated on each of the F surface (11F) side and the B surface (11B) side of the core substrate 11 (see FIG. 5B; in FIG. 5B, only the F surface (11F) side is illustrated; this applies also in FIGS. 6A-7B in the following). In this case, the via conductors 18 penetrating the build-up insulating layers 15 are formed, and build-up insulating layers (16, 16) that are adjacent to each other in the lamination direction are connected to each other by the via conductors 18.

(5) As illustrated in FIG. 6A, a build-up insulating layer 15 is laminated and a build-up conductor layer 16 is laminated on the build-up insulating layer 15, and the second build-up conductor layer (16B) is formed. In this case, the conductor circuit layer (31B), which is connected to an inner side build-up conductor layer 16 via the via conductors 18, and the solid-shaped plane layer (31A) are formed in the second build-up conductor layer (16B).

(6) As illustrated in FIG. 6B, on the second build-up conductor layer (16B), a build-up insulating layer 15 and a build-up conductor layer 16 are laminated, and the first build-up insulating layer (15A) and the first build-up conductor layer (16A) are formed. In this case, on the plane layer (31A), only the first build-up insulating layer (15A) is laminated. Further, in the first build-up conductor layer (16A), the conductor circuit layer 35 connected to the conductor circuit layer (31B) via the via conductors 18 penetrating the first build-up insulating layer (15A) is formed.

(7) As illustrated in FIG. 7A, on the first build-up conductor layer (16A), the protective insulating layer 34 formed of the same material as the build-up insulating layers 15 is laminated. In this case, on the plane layer (31A), the first build-up insulating layer (15A) and the protective insulating layer 34 are laminated.

(8) As illustrated in FIG. 7B, by irradiating, for example, CO2 laser, the cavity 30 that exposes the plane layer (31A) as the bottom surface thereof is formed in the protective insulating layer 34 and the first build-up insulating layer (15A). Here, an area of a range in which laser is irradiated, that is, an opening area of the cavity 30, is smaller than an area of the plane layer (31A), so that the entire bottom surface of the cavity 30 is formed by the plane layer (31A) alone.

(9) A desmear treatment is performed in the cavity 30, and the roughened part 36 is formed on the surface of the plane layer (31A) exposed as the bottom surface of the cavity 30 by subjecting the plane layer (31A) to a CZ treatment. During the desmear treatment and the CZ treatment, the conductor circuit layer (31B) included in the second build-up conductor layer (16B) is protected by the protective insulating layer 34. As a result, the cavity-having substrate 10 illustrated in FIG. 2 is completed.

The above is the description about the method for manufacturing the cavity-having substrate 10. Next, a method for manufacturing the electronic component built-in wiring board 100 using the cavity-having substrate 10 is described.

The electronic component built-in wiring board 100 is manufactured as follows.

Figure 9A:
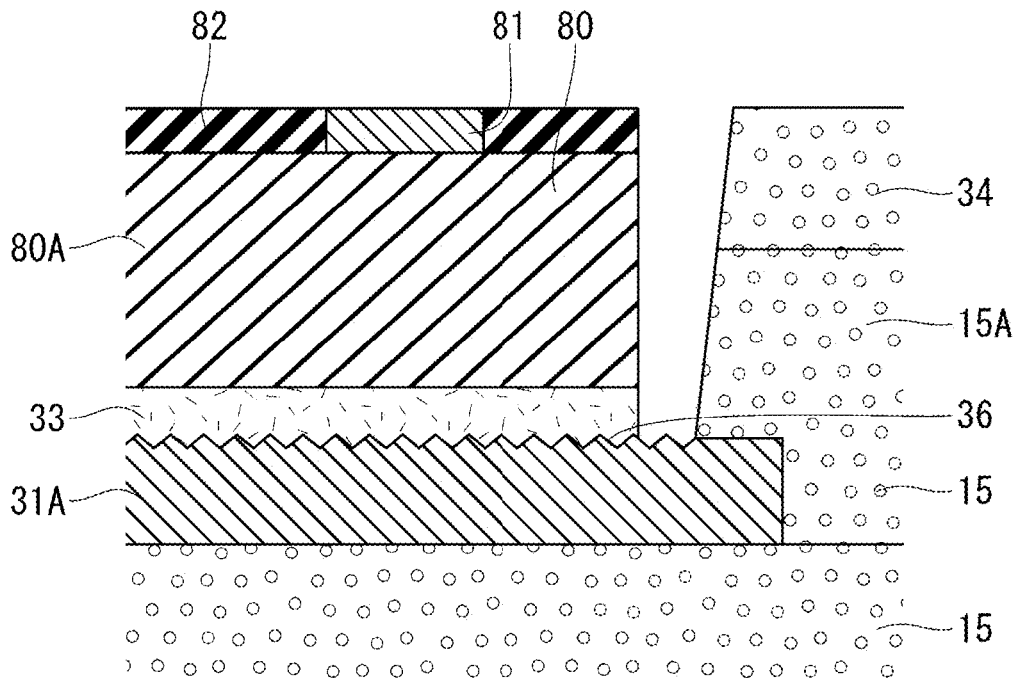
FIGS. 9A and 9B are cross-sectional views illustrating manufacturing processes of the electronic component built-in wiring board.

(1) As illustrated in FIGS. 8A and 9A, the adhesive layer 33 is laminated on the plane layer (31A) exposed as the bottom surface of the cavity 30, and the semiconductor component 80 is placed on the adhesive layer 33, and a thermal curing treatment is performed.

Figure 9B:
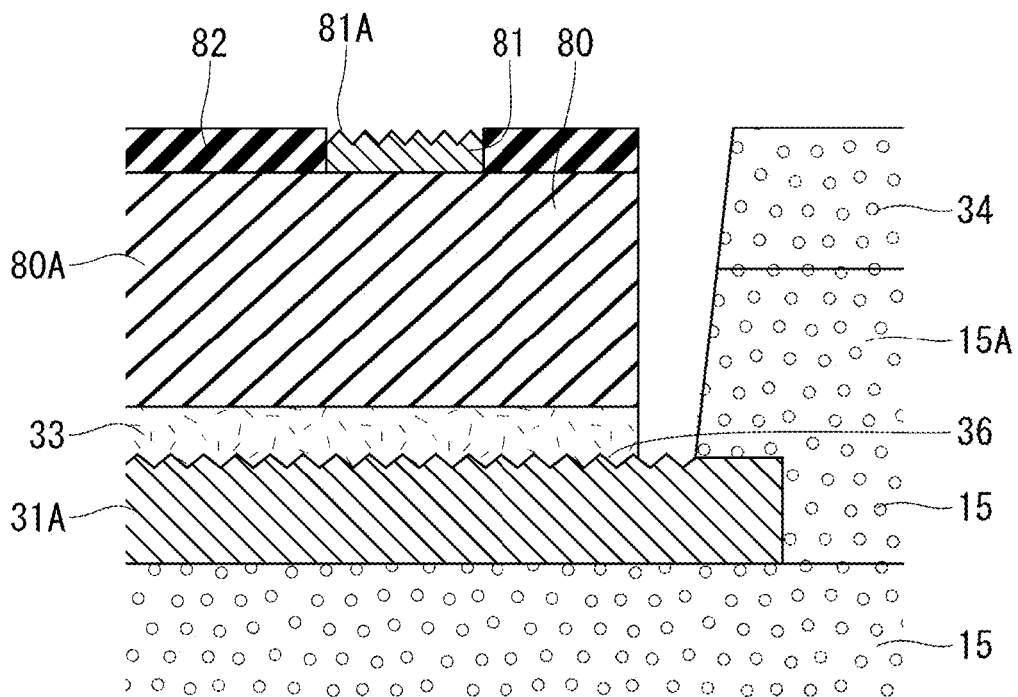

(2) As illustrated in FIG. 9B, the pads 81 of the semiconductor component 80 are subjected to a CZ treatment, and the roughened parts (81A) are formed. The pads 81 are flush with the passivation film 82 before the CZ treatment, and are slightly recessed relative to the passivation film 82 after the CZ treatment.

Figure 10A:
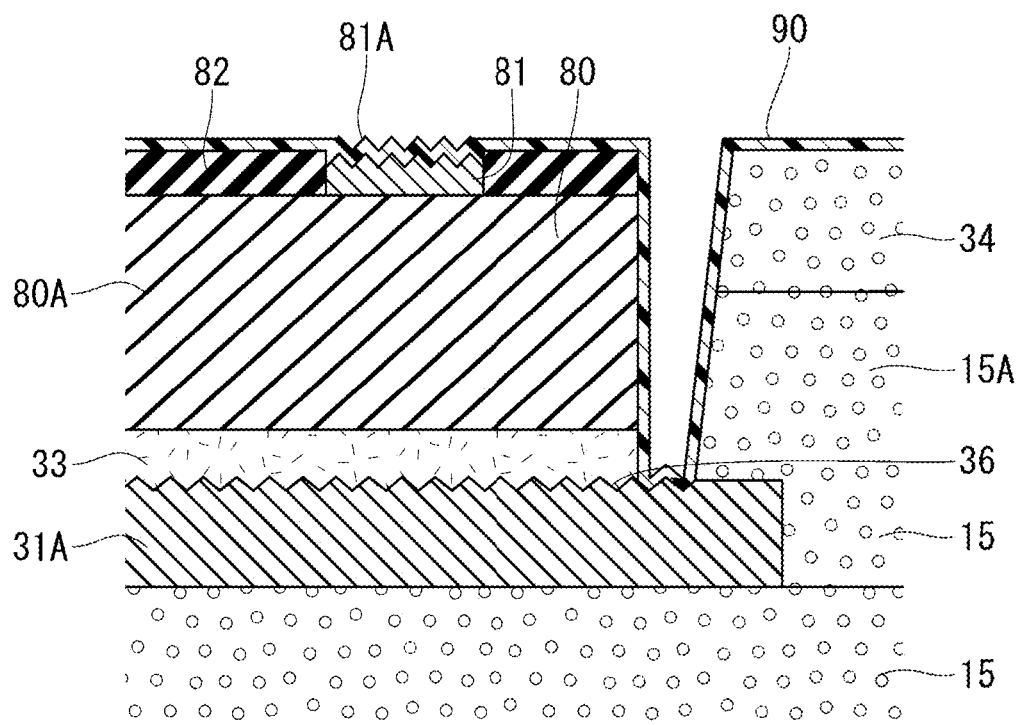
FIGS. 10A and 10B are cross-sectional views illustrating manufacturing processes of the electronic component built-in wiring board.

(3) By immersing the substrate in a liquid containing an amino group-containing triazole-based compound, the resin coating 90 is formed on the surfaces on the F surface (10F) side and the B surface (10B) side of the cavity-having substrate 10 (see FIG. 10A).

Figure 10B:
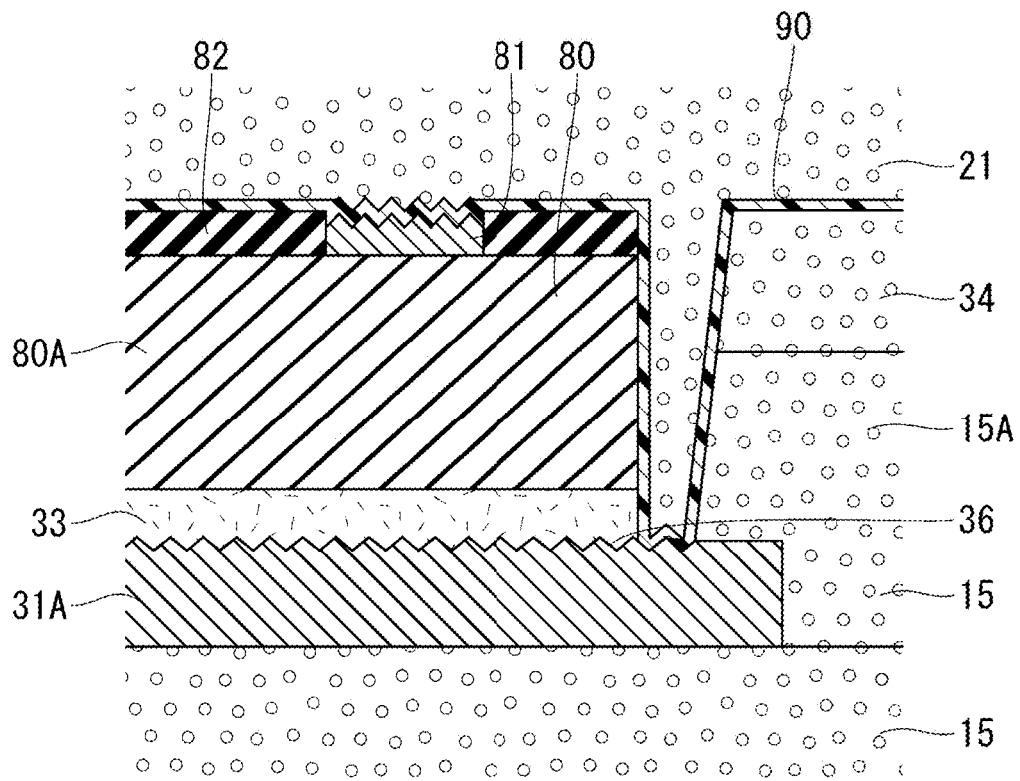

(4) The outer side build-up insulating layer 21 formed of the same material as the build-up insulating layers 15 is laminated on the resin coating 90 on each of the F surface (10F) and the B surface (10B) of the cavity-having substrate 10 (see FIGS. 8B and 10B; in FIGS. 8B and 10B, only the F surface (10F) side is illustrated; this applies also to FIGS. 12A and 12B). In this case, the resin of the outer side build-up insulating layer 21 is also filled between the inner side surface of the cavity 30 and the side surface of the semiconductor component 80.

(5) The first via formation holes (45A) are formed in the outer side build-up insulating layer 21 and the protective insulating layer 34 by irradiating laser (for example, CO2 laser) (see FIG. 11A), and the third via formation holes 46 are formed by irradiating laser (see FIG. 11B). Next, the second via formation holes (45B) and the through holes (90A) having smaller diameters than the first via formation holes (45A) are formed in the outer side build-up insulating layer 21 and the resin coating 90 by irradiating laser (for example, ultraviolet laser) (see FIGS. 12A and 13). Then, the via formation holes (45A, 45B, 46) and the through holes (90A) are subjected to a desmear treatment.

(6) An electroless plating treatment, a plating resist treatment and an electrolytic plating treatment are performed. The first via conductors (25A) and the second via conductors (25B) are respectively formed in the first via formation holes (45A) and the second via formation holes (45B) on the F surface (10F) side of the cavity-having substrate 10 (see FIG. 12B), and the third via conductors 26 are formed in the third via formation holes 46 on the B surface (10B) side of the cavity-having substrate 10. Further, the outer side build-up conductor layers 22 (the F-surface outer side build-up conductor layer (22F) and the B-surface outer side build-up conductor layer (22B)) are respectively formed on the outer side build-up insulating layers 21.

Figure 13:
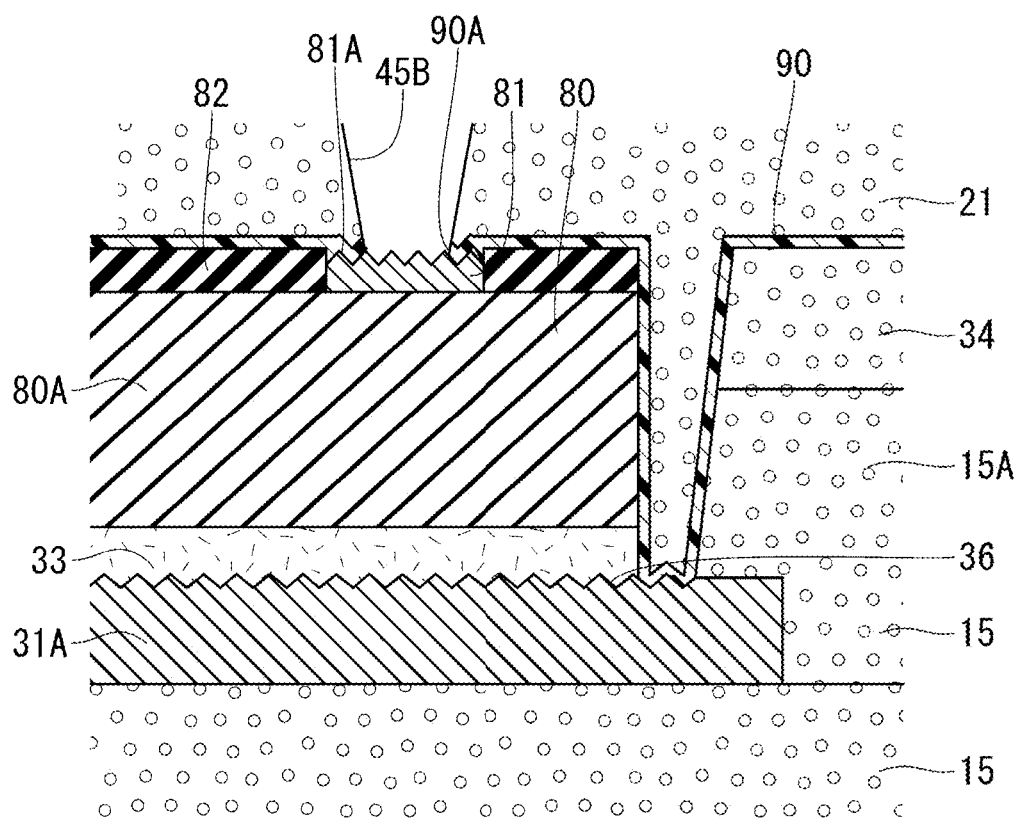
FIG. 13 is a cross-sectional view illustrating a manufacturing process of the electronic component built-in wiring board.
Figure 14:
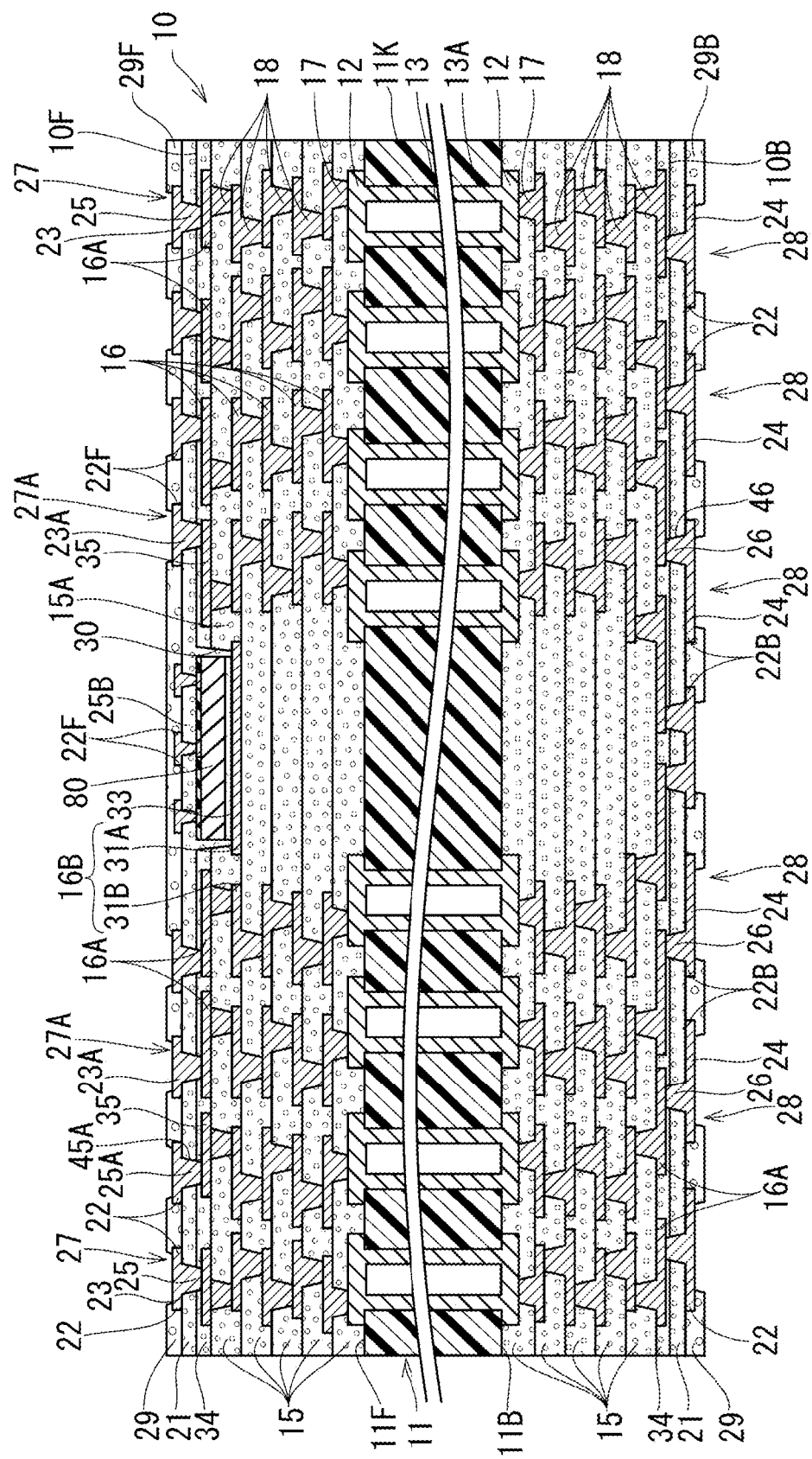
FIG. 14 is a cross-sectional view illustrating a manufacturing process of the electronic component built-in wiring board.

(7) As illustrated in FIG. 13, the solder resist layers 29 are respectively laminated on the outer side build-up conductor layers 22 from both the F surface (10F) side and the B surface (10B) side of the cavity-having substrate 10; and, by a lithographic treatment, the first openings (27A) that respectively expose portions of the F-surface outer side build-up conductor layer (22F) as the first conductor pads (23A) are formed in the F-surface solder resist layer (29F) on the F surface (10F) side of the cavity-having substrate 10, and the third openings 28 that respectively expose portions of the B-surface outer side build-up conductor layer (22B) as the third conductor pads 24 are formed in the B-surface solder resist layer (29B) on the B surface (10B) side.

Figure 15:
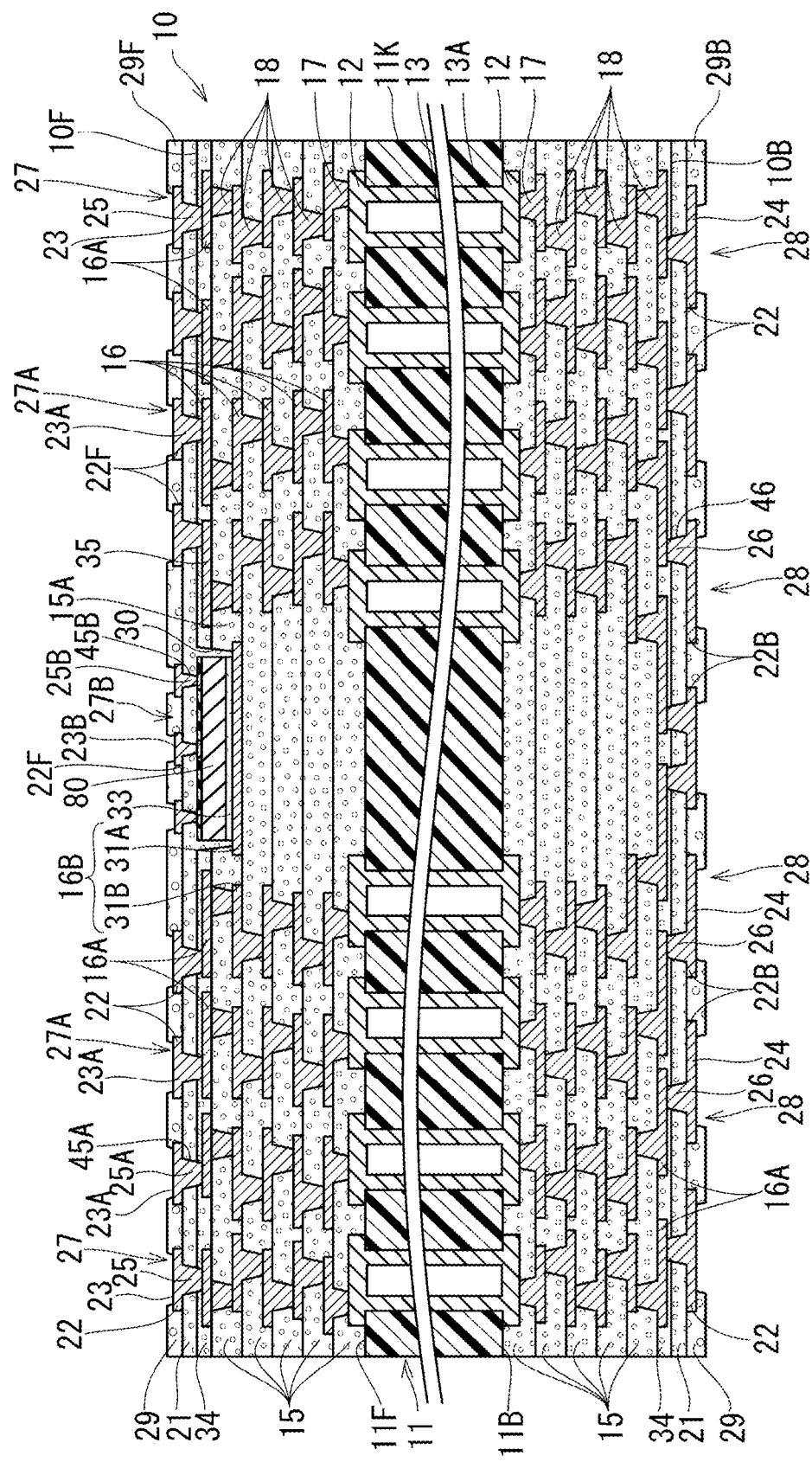
FIG. 15 is a cross-sectional view illustrating a manufacturing process of the electronic component built-in wiring board.

(8) As illustrated in FIG. 15, by irradiating laser (for example, ultraviolet laser), the second openings (27B) that respectively expose portions of the F-surface outer side build-up conductor layer (22F) as the second conductor pads (23B) are formed. The second conductor pads (23B) are subjected to a desmear treatment.

Figure 16:
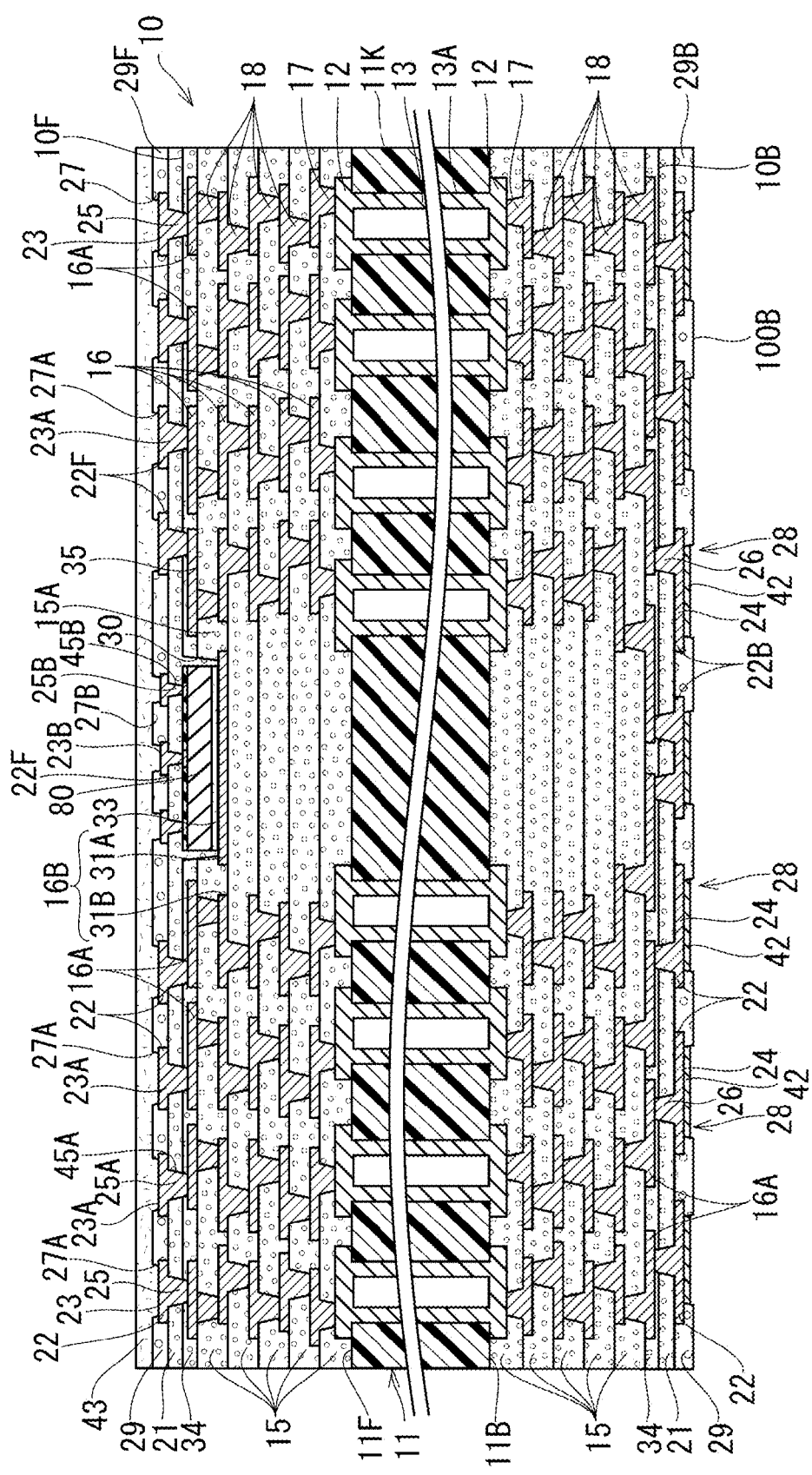
FIG. 16 is a cross-sectional view illustrating a manufacturing process of the electronic component built-in wiring board.

(9) As illustrated in FIG. 16, the F-surface solder resist layer (29F) is covered by a resin protective film 43. Then, the B surface (10B) side of the cavity-having substrate 10 is subjected to an electroless plating treatment, and the B-surface plating layers 42 are respectively formed on the third conductor pads 24. Specifically, first, the substrate formed by covering the F-surface solder resist layer (29F) with the resin protective film 43 is immersed in an electroless nickel plating solution for a predetermined time period, and a Ni layer is formed. Next, the resulting substrate is immersed in an electroless palladium plating solution for a predetermined time period, and a Pd layer is formed. Further, the resulting substrate is immersed in an electroless gold plating solution for a predetermined time period, and an Au layer is formed. When the electroless plating treatment is performed, the second conductor pads (23B) and first conductor pads (23A) are protected by the resin protective film 43.

Figure 17:
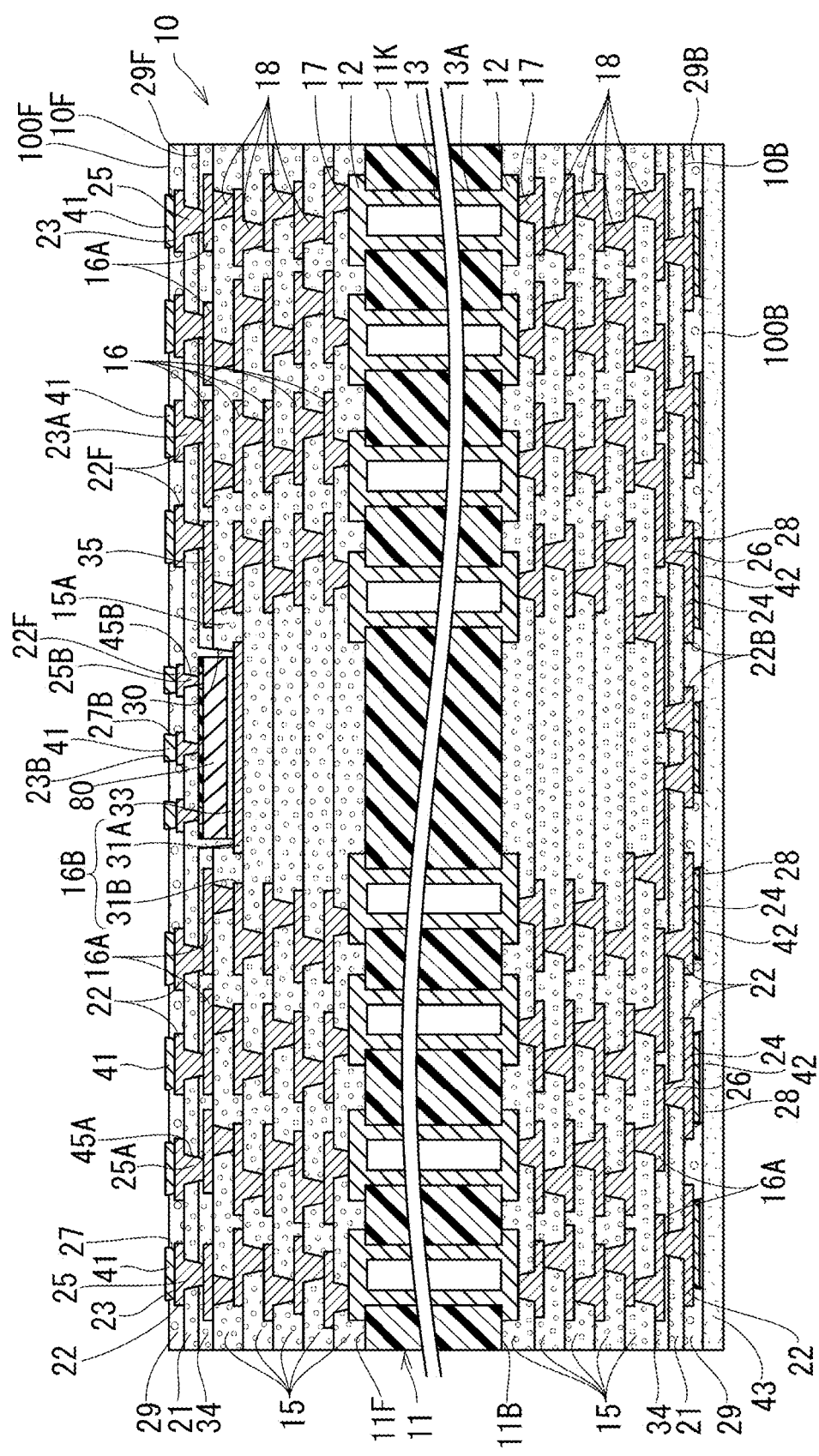
FIG. 17 is a cross-sectional view illustrating a manufacturing process of the electronic component built-in wiring board.

(10) As illustrated in FIG. 17, the resin protective film 43 that covers the F-surface solder resist layer (29F) is removed, and the B-surface solder resist layer (29B) is covered by a resin protective film 43. Then, similar to the process of FIG. 16, the F surface (10F) side of the cavity-having substrate 10 is subjected to an electroless plating treatment, and the F-surface plating layers 41 are respectively formed on the first conductor pads (23A) and the second conductor pads (23B). In this case, the B-surface plating layers 42 are protected by the resin protective film 43.

(11) The resin protective film 43 that covers the B-surface solder resist layer (29B) is removed, and the electronic component built-in wiring board 100 illustrated in FIG. 1 is completed.

The description about the structure and the manufacturing method of the electronic component built-in wiring board 100 of the present embodiment is as given above. Next, an operation effect of the electronic component built-in wiring board 100 is described.

In the electronic component built-in wiring board 100 of the present embodiment, the resin coating 90 having a stronger adhesion to the passivation film 82 than to the outer side build-up insulating layer 21 is formed between the pads 81 of the semiconductor component 80 and the outer side build-up insulating layer 21. Therefore, peeling of the outer side build-up insulating layer 21 from the semiconductor component 80 is suppressed. In addition, the adhesion between the resin coating 90 and the passivation film 82 is also stronger than the adhesion between the outer side build-up insulating layer 21 and the passivation film 82. Therefore, peeling of the outer side build-up insulating layer 21 together with the resin coating 90 is also prevented. Further, since the resin coating 90 is also formed on the side surface of the semiconductor component 80, the adhesion is further stabilized.

Further, since the upper surfaces of the pads 81 of the semiconductor component 80 are formed as the roughened parts (81A), and the resin coating 90 is also formed on the roughened parts (81A), and anchor effect is obtained, so the resin coating 90 is further unlikely to peel off. Further, since the resin coating 90 extends to positions in contact with the second via conductors (25B), an area formed on the roughened parts (81A) is increased, and the anchor effect is further increased. Further, since the resin coating 90 has a rust prevention property, the manufacturing process is simplified as compared to a case where a rust preventive film and a peeling preventive film are separately formed.

OTHER EMBODIMENTS

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

(1) In the above embodiment, as an electronic component according to an embodiment of the present invention, the semiconductor component 80 is described as an example. However, the electronic component may also be a semiconductor element, or a passive element such as a chip capacitor, an inductor, a resistor, or the like, or an interposer.

(2) In the above embodiment, the electronic component built-in wiring board 100 may also be a coreless substrate that does not have the core substrate 11.

(3) It is also possible to have a structure in which a resin sheet having through holes (90A) formed therein in advance is pasted to form the resin coating 90. In this case, it is not necessary for the inner edges of the through holes (90A) to be respectively flush with the inner surfaces of the second via formation holes (45B).

(4) It is not necessary for the pads 81 of the semiconductor component 80 to be roughened.

(5) It is also possible that the resin coating 90 is formed only on the surface of the semiconductor component 80. Further, it is also possible that the resin coating 90 is formed only on the passivation film 82 of the surface of the semiconductor component 80.

(6) It is also possible that the semiconductor component 80 does not have the passivation film 82, and the pads 81 are each formed in a protruding shape.

In the electronic component built-in wiring board and a method for manufacturing the electronic component built-in wiring board in Japanese Patent Application Laid-Open Publication No. 2006-019441, suppression of peeling between the coating insulating layer and the electronic component is desired.

According to an embodiment of the present invention, an electronic component built-in wiring board includes: a cavity-having substrate having a cavity that opens on one of a front side and a back side; an electronic component that is accommodated in the cavity and has pads on a surface thereof; a coating insulating layer formed on the cavity-having substrate and the electronic component; multiple via holes penetrating the coating insulating layer; and via conductors respectively formed in the via holes. A resin coating having adhesion to the electronic component that is stronger than adhesion of the coating insulating layer to the electronic component is formed between the electronic component and the coating insulating layer, and through holes for respectively partially exposing the pads in the via holes are formed in the resin coating.

A method for manufacturing an electronic component built-in wiring board according to another embodiment of the present invention includes: forming a cavity-having substrate having a cavity that opens on one of a front side and a back side; accommodating an electronic component having pads on a surface thereof in the cavity; forming a coating insulating layer on the cavity-having substrate and the electronic component; forming via holes in the coating insulating layer; and forming via conductors in the via holes. The method further includes: forming a resin coating having adhesion to the electronic component that is stronger than adhesion of the coating insulating layer to the electronic component between the electronic component and the coating insulating layer; and forming through holes in the resin coating for respectively partially exposing the pads in the via holes.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic component built-in wiring board, comprising:
  a substrate having a cavity;
  an electronic component accommodated in the cavity of the substrate and having a plurality of pads on a surface of the electronic component;
  a coating insulating layer comprising an insulating material and formed on the substrate such that the coating insulating layer is covering the electronic component and has a plurality of via holes;

a plurality of via conductors formed in the plurality of via holes of the coating insulating layer respectively such that the plurality of via conductors is penetrating through the coating insulating layer; and a resin coating comprising a resin material and formed between the electronic component and the coating insulating layer and entirely between the substrate and the coating insulating layer such that the resin coating has a plurality of through holes partially exposing the plurality of pads in the plurality of via holes of the coating insulating layer, respectively, wherein the coating insulating layer comprises resin and is formed such that the resin of the coating insulating layer is filling a space between an inner surface of the cavity and the electronic component accommodated in the cavity, the resin material of the resin coating is different from the insulating material of the coating insulating layer such that the resin coating has an adhesion to the electronic component that is stronger than an adhesion of the coating insulating layer to the electronic component, the plurality of via conductors is formed in the plurality of via holes and the plurality of through holes respectively such that the plurality of via conductors is connected to the plurality of pads on the surface of the electronic component, and the resin coating is formed such that the resin coating is formed on the surface and a side surface of the electronic component, on an inner surface of the cavity, and on a bottom surface of the cavity between the inner surface of the cavity and the side surface of the electronic component.

2. The electronic component built-in wiring board according to claim 1, wherein the electronic component is a semiconductor component that has a passivation film comprising a silicon compound and formed between the pads on the surface of the electronic component.

3. The electronic component built-in wiring board according to claim 2, wherein the silicon compound of the passivation film is silicon nitride.

4. The electronic component built-in wiring board according to claim 3, wherein the resin coating is formed such that the plurality of through holes has inner edges that are formed flush with inner surfaces of the via holes respectively.

5. The electronic component built-in wiring board according to claim 4, wherein the plurality of pads on the electronic component has surfaces having roughened portions respectively, and the resin coating is formed such that the plurality of through holes has opening edge portions formed on uneven shapes of the roughened portions respectively.

6. The electronic component built-in wiring board according to claim 3, wherein the plurality of pads on the electronic component has surfaces having roughened portions respectively, and the resin coating is formed such that the plurality of through holes has opening edge portions formed on uneven shapes of the roughened portions respectively.

7. The electronic component built-in wiring board according to claim 2, wherein the resin coating is formed such that the plurality of through holes has inner edges that are formed flush with inner surfaces of the via holes respectively.

8. The electronic component built-in wiring board according to claim 2, wherein the plurality of pads on the electronic component has surfaces having roughened portions respectively, and the resin coating is formed such that the plurality of through holes has opening edge portions formed on uneven shapes of the roughened portions respectively.

9. The electronic component built-in wiring board according to claim 2, wherein the plurality of pads on the electronic component has surfaces having roughened portions respectively.

10. The electronic component built-in wiring board according to claim 1, wherein the resin coating is formed such that the plurality of through holes has inner edges that are formed flush with inner surfaces of the via holes respectively.

11. The electronic component built-in wiring board according to claim 10, wherein the plurality of pads on the electronic component has surfaces having roughened portions respectively, and the resin coating is formed such that the plurality of through holes has opening edge portions formed on uneven shapes of the roughened portions respectively.

12. The electronic component built-in wiring board according to claim 1, wherein the plurality of pads on the electronic component has surfaces having roughened portions respectively, and the resin coating is formed such that the plurality of through holes has opening edge portions formed on uneven shapes of the roughened portions respectively.

13. A method for manufacturing an electronic component built-in wiring board, comprising:

forming a structure comprising a substrate having a cavity, an electronic component accommodated in the cavity of the substrate and having a plurality of pads on a surface of the electronic component, a coating insulating layer comprising an insulating material and formed on the substrate such that the coating insulating layer is covering the electronic component and has a plurality of via holes, and a resin coating comprising a resin material and formed between the electronic component and the coating insulating layer and entirely between the substrate and the coating insulating layer such that the resin coating has a plurality of through holes partially exposing the plurality of pads in the plurality of via holes respectively; and forming a plurality of via conductors in the plurality of via holes and the plurality of through holes respectively such that the plurality of via conductors is connected to the plurality of pads on the surface of the electronic component, wherein the coating insulating layer comprises resin and is formed such that the resin of the coating insulating layer is filling a space between an inner surface of the cavity and the electronic component accommodated in the cavity, the resin material of the resin coating is different from the insulating material of the coating insulating layer such that the resin coating has an adhesion to the electronic component that is stronger than an adhesion of the coating insulating layer to the electronic component, and the resin coating is formed such that the resin coating is formed on the surface and a side surface of the electronic component, on an inner surface of the cavity, and on a bottom surface of the cavity between the inner surface of the cavity and the side surface of the electronic component.

14. The method for manufacturing an electronic component built-in wiring board according to claim 13, wherein the forming of the structure comprises forming the substrate having the cavity, accommodating the electronic component in the cavity of the substrate, forming the resin coating on the substrate such that the resin coating covers the electronic component accommodated in the cavity of the substrate, forming the coating insulating layer on the resin coating such that the resin coating is formed between the electronic component and the coating insulating layer, and forming the plurality of via holes in the coating insulating layer and the plurality of through holes in the resin coating such that the through holes are partially exposing the pads in the via holes respectively.

15. The method for manufacturing an electronic component built-in wiring board according to claim 13, wherein the resin coating is formed by immersing the electronic component in a liquid comprising a resin which forms the resin coating.

16. The method for manufacturing an electronic component built-in wiring board according to claim 13, wherein the via holes and the through holes are formed by penetrating the coating insulating layer and the resin coating together.

17. The method for manufacturing an electronic component built-in wiring board according to claim 13, wherein the electronic component is a semiconductor component that has a passivation film comprising a silicon compound and formed between the pads on the surface of the electronic component.

18. The method for manufacturing an electronic component built-in wiring board according to claim 17, wherein the silicon compound of the passivation film is silicon nitride.

19. The method for manufacturing an electronic component built-in wiring board according to claim 13, wherein the forming of the structure includes roughening surfaces of the plurality of pads respectively, and forming the resin coating after the roughening of the surfaces of the pads.

20. The electronic component built-in wiring board according to claim 1, wherein the plurality of pads on the electronic component has surfaces having roughened portions respectively.

* * * * *